(12) United States Patent
Konishi

(10) Patent No.: US 8,717,205 B2
(45) Date of Patent: May 6, 2014

(54) PARALLEL DIFFERENTIAL ENCODING CIRCUITS

(75) Inventor: Yoshiaki Konishi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/823,158

(22) PCT Filed: Dec. 6, 2010

(86) PCT No.: PCT/JP2010/007085
§ 371 (c)(1),
(2), (4) Date: Mar. 14, 2013

(87) PCT Pub. No.: WO2012/077155
PCT Pub. Date: Jun. 14, 2012

(65) Prior Publication Data
US 2013/0181853 A1 Jul. 18, 2013

(51) Int. Cl.
*H03M 7/30* (2006.01)
(52) U.S. Cl.
USPC .............................................. 341/76; 341/143
(58) Field of Classification Search
USPC ..................................... 341/76, 143
See application file for complete search history.

(56) References Cited

U.S. PATENT DOCUMENTS

| 5,233,630 | A | * | 8/1993 | Wolf ............................. 375/308 |
| 7,327,961 | B2 | * | 2/2008 | Griffin ........................ 398/188 |
| 7,398,450 | B2 | * | 7/2008 | Konishi et al. ................ 714/772 |
| 7,428,692 | B2 | * | 9/2008 | Konishi et al. ................ 714/772 |
| 8,331,799 | B2 | * | 12/2012 | Zhang et al. ................ 398/188 |
| 2007/0053697 | A1 | | 3/2007 | Konishi et al. |
| 2007/0061660 | A1 | | 3/2007 | Konishi et al. |

FOREIGN PATENT DOCUMENTS

| JP | 11 122205 | 4/1999 |
| JP | 3011235 | 2/2000 |
| JP | 2007 67904 | 3/2007 |
| JP | 2007 74167 | 3/2007 |

OTHER PUBLICATIONS

International Search Report Issued Feb. 15, 2011 in PCT/JP10/07085 Filed Dec. 6, 2010.

* cited by examiner

*Primary Examiner* — Khai M Nguyen
(74) *Attorney, Agent, or Firm* — Oblon, Spivak, McClelland, Maier & Neustadt, L.L.P.

(57) ABSTRACT

A first differential encoding circuit is configured to perform a differential encoding on n-lines parallel input data to generate n-lines parallel output data. A second differential encoding circuit is configured to perform a differential encoding on n-lines parallel input data to generate n-lines parallel output data. A multiplexing circuit is configured to alternately multiplex the generated parallel output data from the first differential encoding circuit and the second differential encoding circuit, and configured to output the multiplexed data.

4 Claims, 6 Drawing Sheets

PARALLEL DIFFERENTIAL ENCODING CIRCUITS

TECHNICAL FIELD

This invention relates to parallel differential encoding circuits which are used in communication devices, such as an optical fiber transmission device, a wireless transceiver and the like.

BACKGROUND ART

Recently, as a method to achieve ultra high-speed and large-capacity signal transmission in an optical transmission system, a phase modulation technique such as Differential Quadrature Phase Shift Keying (DQPSK) and a digital coherent technique such as Dual-Polarized Quadrature Phase Shift Keying (DP-QPSK) are under active investigation. In order to seek a further expanded transmission distance, such a method of Alternate Polarization Differential Phase Shift Keying (Apol-DPSK) is also under consideration, which uses orthogonally polarized different waves alternately for symbols to be transmitted.

In optical DPSK and DQPSK methods, a wave detector is utilized in a receiver having a delayed interferometer that detects phase difference between two adjacent symbols of transmission. Accordingly, a transmitter is required to have a circuit called as a differential encoding circuit or a pre-coder that pre-assigns transmission data to phase differences. In a digital coherent method, although the phase of light received is detected by using receiver's local light, its absolute phase at a transmitter is unknown, thus making it unable to reproduce the data. For dealing therewith, a differential encoding may be employed because it is capable of reproducing data even if the initial phase is unknown.

In a conventional Alternate Polarization Differential Phase Shift Keying (Apol-DPSK) method, by using polarized waves orthogonal for every one symbol, withstanding ability is enhanced against signal degradation due to a non-linear effect, such as self-phase modulation. In this method, the receiver is required to extract data by performing a delay interference on each optical signal having the same polarized wave which is received every other symbol. In a general DPSK method, a differential encoding is performed to assign data to a phase difference of optical signals between two adjacent symbols. In contrast, in an Apol-DPSK method, a differential encoding circuit is required to perform a differential encoding between every two symbols.

While processing a differential encoding is accomplished by a high-speed digital circuit, the last output information on an optical signal phase has to be retained in a delay element to calculate a phase difference. This means that, in the differential encoding circuit, there is a feedback path which operates at a symbol rate. Since the bit rate in optical transmission is ultra-high, for instance, 40 Gbps or 100 Gbps, and the feedback path is required to operate at several tens GHz, it makes the differential encoding circuit extremely difficult to be implemented.

For dealing with the foregoing problem, there have been developed various differential encoding circuits operable at a high-rate. For example, Patent Document 1 mentioned below discloses a circuit-production technique that reduces an operation speed of a digital circuit by laying out a differential encoding circuit in parallel configuration, and thereby enables implementation of the digital circuit through a general LSI process.

CITATION LIST

Patent Document 1: Japanese Patent No. 3011235

SUMMARY OF THE INVENTION

However, in the parallel differential encoding circuit as described in Patent Document 1, the data having been processed by differential encoding are output for every one symbol after subjected to multiplexing. There is a problem that this circuit is unable to use for a long-distance transmission format which requires a two-symbol delay detection, as that in the Apol-DPSK method or an Apol-DQPSK method.

The present invention has been made to solve the foregoing problem. An object thereof is to provide a parallel differential encoding circuit suitable for a long-distance transmission format.

A parallel differential encoding circuit according to the invention performs a differential encoding on parallel input data to generate parallel output data, and includes: a first differential encoding circuit configured to perform a differential encoding on n-lines parallel input data ($2 \leq n$; n denotes an integer) to generate n-lines parallel output data ($2 \leq n$; n denotes an integer); a second differential encoding circuit configured to perform a differential encoding on n-lines parallel input data ($2 \leq n$; n denotes an integer) to generate n-lines parallel output data ($2 \leq n$; n denotes an integer); and a multiplexing circuit configured to alternately multiplex the generated parallel output data from the first differential encoding circuit and the second differential encoding circuit, and configured to output the multiplexed data.

This configuration is capable of achieving a parallel differential encoding circuit suitable for a long-distance transmission format.

DESCRIPTION OF EMBODIMENTS

Hereinafter, for illustrating the present invention in more detail, embodiments for carrying out the present invention will be described with reference to the drawings.

(Embodiment 1.)

Figure 1:
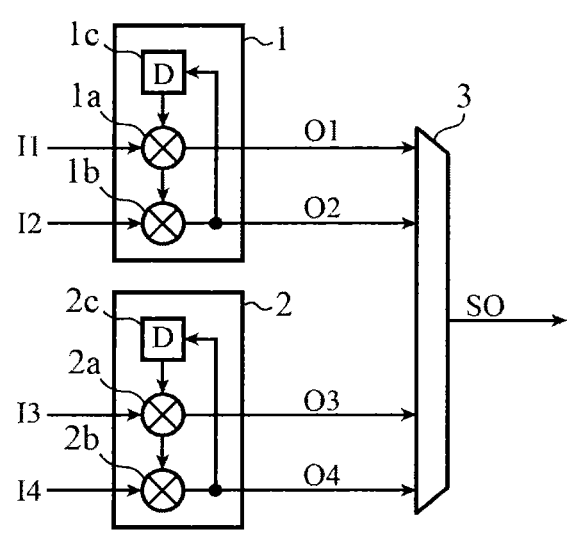
FIG. 1 is a configuration diagram showing a parallel differential encoding circuit of Embodiment 1 of the present invention.

FIG. 1 is a configuration diagram showing a parallel differential encoding circuit of this embodiment.

The parallel differential encoding circuit of this embodiment includes a first differential encoding circuit 1, a second differential encoding circuit 2 and a multiplexing circuit 3. The first differential encoding circuit 1 and the second differential encoding circuit 2 are each a differential encoding circuit for DPSK. The first differential encoding circuit 1 performs calculations using two lines parallel input data I1 and I2, and outputs two lines parallel output data O1 and O2. The first differential encoding circuit 1 is configured with exclusive OR logic circuits 1a-1b and a delay element 1c. The first differential encoding circuit 1 includes a feedback path where the parallel output data O2 from the exclusive OR logic circuit 1b is delayed by the delay element 1c and is subjected to an exclusive OR logical operation with the parallel input data I1 by the exclusive OR circuit 1a. The second differential encoding circuit 2 has a configuration similar to that of the first differential encoding circuit 1. The second differential encoding circuit 2 performs calculations using two lines of parallel input data I3 and I4, and outputs two lines parallel output data O3 and O4. The second differential encoding circuit 2 is configured with exclusive OR logic circuits 2a-2b and a delay element 2c. The second differential encoding circuit 2 includes a feedback path where the parallel output data O4 from the exclusive OR logic circuit 2b is delayed by the delay element 2c and is subjected to an exclusive OR logical operation with the parallel input data I3 by the exclusive OR circuit 2a. The multiplexing circuit 3 is a 4:1 multiplexer (MUX) which performs a time-multiplexing on four lines parallel output signals. The multiplexing circuit 3 performs the time-multiplexing on the parallel output data O1 to O4 in an order of O1-O3-O2-O4, and outputs those data O1 to O4 as a serial output SO at a four times rate.

Figure 2:
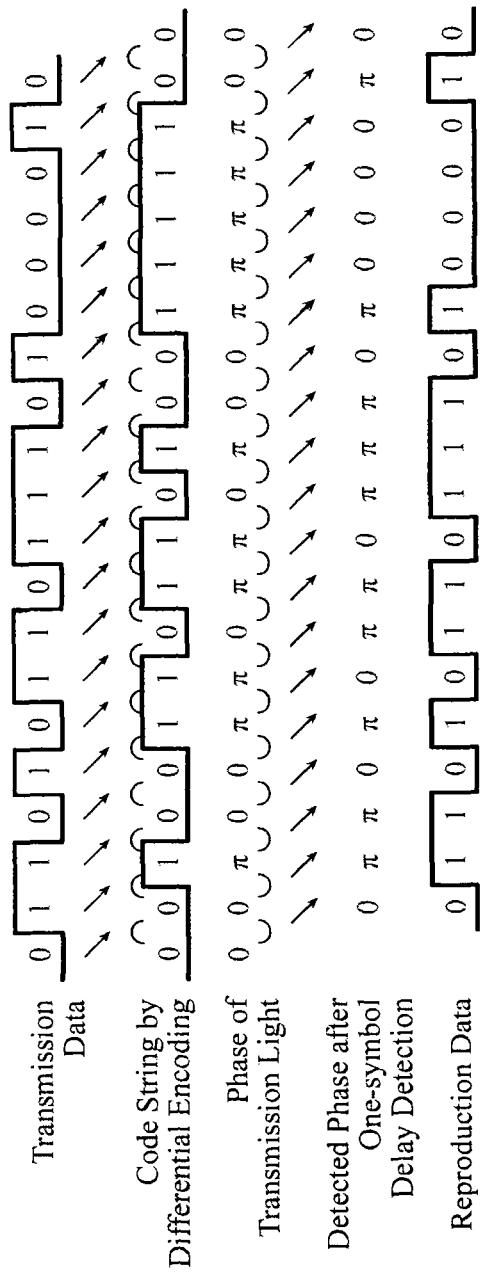
FIG. 2 is a timing chart showing a relationship between transmission data and optical phases by a DPSK method.
Figure 3:
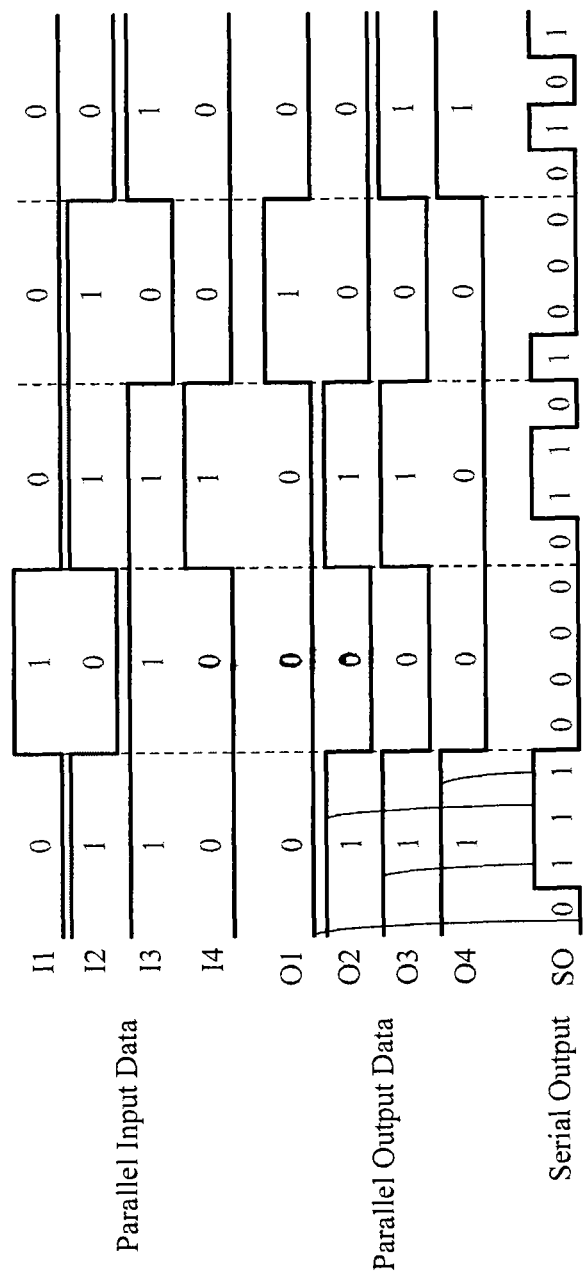
FIG. 3 is a timing chart showing an operation of the parallel differential encoding circuit of Embodiment 1 of the present invention.

FIG. 2 is a timing chart illustrating a relation between transmission data and optical phases by a general DPSK method. FIG. 3 is a timing chart for illustrating an operation of Embodiment 1 of the present invention.

In a DPSK method, transmission data are assigned to phase differences in transmission light phases modulated by a phase modulator. For example, in FIG. 2, assuming that transmission data "0" represents no phase-change and transmission data "1" represents phase-inversion, a transmission data line "01101011011101000010" becomes "01001101101001111100" as a data line after one-symbol differential encoding. With respect to the data line after one-symbol differential encoding, by converting the data "0" to a phase "0" and converting the data "1" to a phase "π" through the phase modulator, "00π00ππ0π0π00ππππ00" is acquired as a phase line of transmission light. In a receiver, phase differences are detected by a delay detection operation. If two adjacent symbols are "00" and "ππ", the detected phase indicates "0". If two adjacent symbols are "0π" and "π0", the detected phase indicates "π". Accordingly, in the case of FIG. 2, detected phases after delay detection indicate "0ππ0π0π0ππ0π0000π0". By converting those phases into electric signals to reproduce data, a data line "01101011011101000010" is acquired, which is the same as the original transmission data line.

In FIG. 1, assuming that a transmission data line, for instance, "01101010011101000010" is successively distributed to four lines in order from the head portion, and "01000", "10110", "11101" and "00100" are input to the parallel input data I1, I2, I3 and I4, respectively. In this case, the parallel output data O1, O2, O3 and O4 resulted from the operation of the differential encoding circuit become "00010", "10100", "10101" and "10001", respectively, as shown in FIG. 3. Those parallel output data O1 to O4 are multiplexed by the multiplexing circuit 3 in the order of O1-O3-O2-O4 taught in above, and are output in an order of "01110000011010000101" as the serial output SO.

Figure 4:
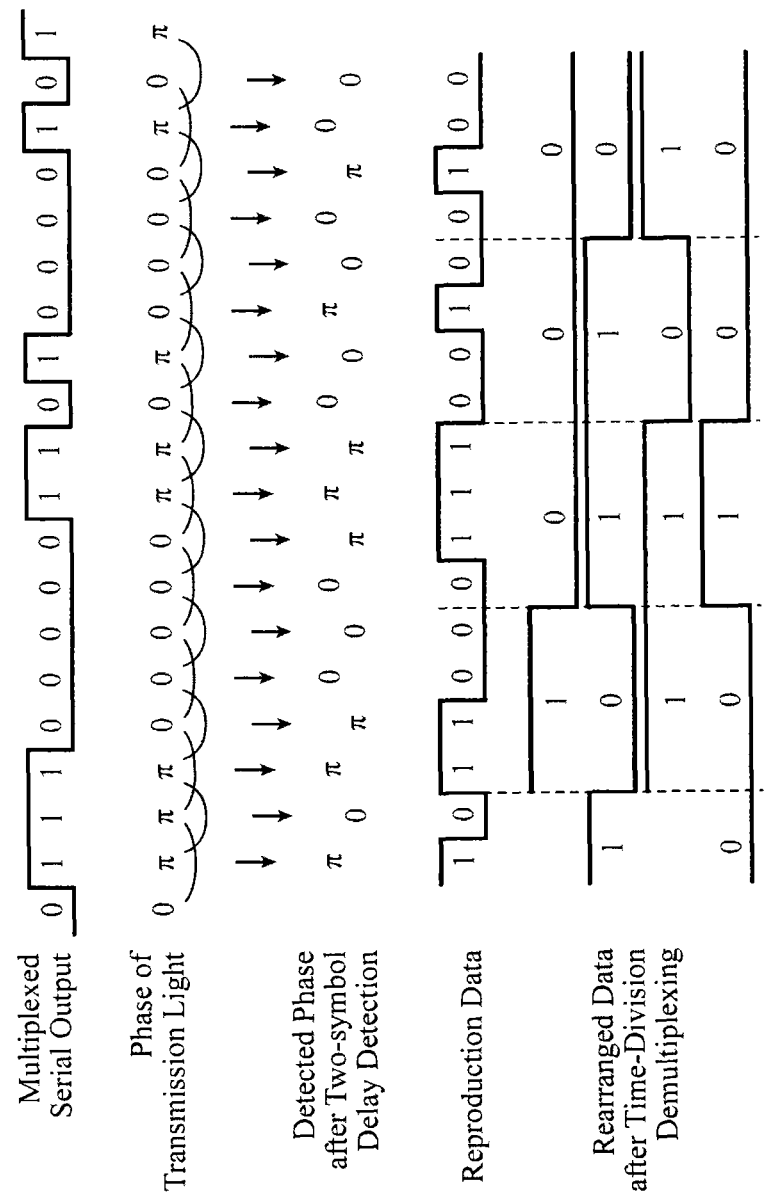
FIG. 4 is a timing chart showing a processing operation by a receiver, of a multiplexed serial output generated by the parallel differential encoding circuit of Embodiment 1 of the present invention.

FIG. 4 shows a phase line in the case where the multiplexed output shown in FIG. 3 (i.e. "Serial Output SO")are modulated by the phase modulator and are subjected to detection of phase differences by a two-symbol delay detector. In FIG. 4, by performing a time-division demultiplexing on the multiplexed serial output to restore data "1000", "10110", "1101" and "00100", the original transmission data line can be reproduced. Note that the phase modulator, the two-symbol delay detector, and a configuration for the time-division demultiplexing are omitted from the figures.

The differential encoding circuit applicable to the DPSK method can be achieved in other way than the method of connecting exclusive OR logic and the delay element shown in Embodiment 1, and thus, the effect according to this Embodiment 1 is not limited to that by the configuration shown in FIG. 1.

As described above, the parallel differential encoding circuit of Embodiment 1 as a parallel differential encoding circuit, that performs a differential encoding on parallel input data to generate parallel output data, which comprises: a first differential encoding circuit configured to perform a differential encoding on n-lines parallel input data (2≤n; n denotes an integer) to generate n-lines parallel output data (2≤n; n denotes an integer); a second differential encoding circuit configured to perform a differential encoding on n-lines parallel input data (2≤n; n denotes an integer) to generate n-lines parallel output data (2≤n; n denotes an integer); and a multiplexing circuit configured to alternately multiplex the generated parallel output data from the first differential encoding circuit and the second differential encoding circuit, and configured to output the multiplexed data. Therefore, the parallel differential encoding circuit of this Embodiment 1 is capable of achieving a differential encoding applicable to a two-symbol delay detection, and enabling optical signals of the Apol-DPSK method to expand transmission distance.

(Embodiment 2.)

Figure 5:
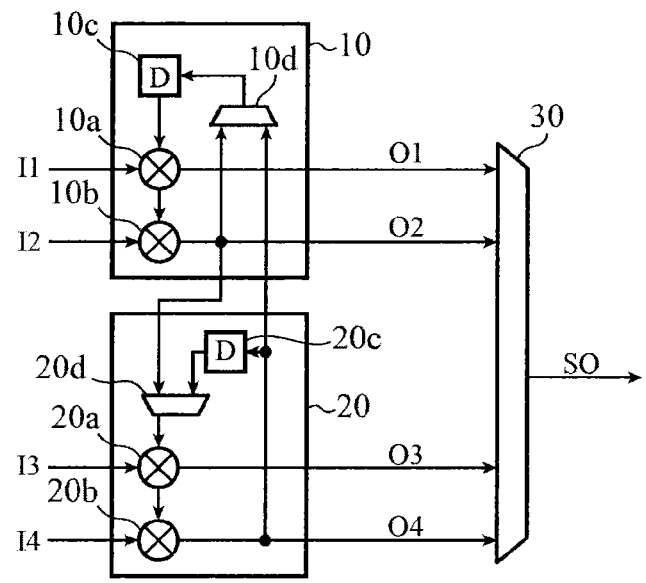
FIG. 5 is a configuration diagram showing a parallel differential encoding circuit of Embodiment 2 of the present invention.

FIG. 5 is a configuration diagram showing a parallel differential encoding circuit of Embodiment 2 of the present invention.

The parallel differential encoding circuit of Embodiment 2 includes a first differential encoding circuit 10, a second differential encoding circuit 20 and a multiplexing circuit 30. The first differential encoding circuit 10 and the second differential encoding circuit 20 include, similarly to Embodiment 1, exclusive OR logic circuits 10a-10b and a delay element 10c, and exclusive OR logic circuits 20a-20b and a delay element 20c, respectively. The first differential encoding circuit 10 and the second differential encoding circuit 20 further include a selector circuit 10d and a selector circuit 20d, respectively. The configurations of the exclusive OR logic circuits 10a-10b and the delay element 10c and the exclusive OR logic circuits 20a-20b and the delay element 20c are similar to those of the exclusive OR logic circuits 1a-1b and the delay element 1c, and the exclusive OR logic circuits 2a-2b and the delay element 2c in Embodiment 1.

The selector circuit 10d is a circuit for selecting parallel output data O4 of the exclusive OR logic circuit 20b in the second differential encoding circuit 20, or parallel output data O2 of the exclusive OR logic circuit 10b in the first differential encoding circuit 10, and supplying the selected output to the delay element 10c. The selector circuit 20d is a circuit for selecting the data delayed by the delay element 20c from the parallel output data O4 of the exclusive OR logic circuit 20b in the second differential encoding circuit 20, or the parallel output data O2 of the exclusive OR logic circuit 10b in the first differential encoding circuit 10, and supplying the selected output to the exclusive OR logic circuit 20a. The multiplexing circuit 30 is, similarly to the multiplexing circuit 3 in Embodiment 1, a 4:1 MUX for time-multiplexing four lines of parallel output signals, which outputs at a four times rate the respective parallel output data in an order of O1-O3-O2-O4 as a serial output SO.

According to Embodiment 2, when the selector circuit 10d in the first differential encoding circuit 10 selects the parallel output data O4-side and the selector circuit 20d in the second differential encoding circuit 20 selects the parallel output data O2-side, it is possible to output one-symbol-delay differential coded signals as the serial output SO having been multiplexed by the multiplexing circuit 30. Meanwhile, when the selector circuit 10d selects the parallel output data O2-side and the selector circuit 20d selects the parallel output data O4-side (i.e. data output side of the delay element 20c), it is possible to achieve a configuration of two-symbol-delay differential encoding circuit similar to Embodiment 1.

As described above, the parallel differential encoding circuit of Embodiment 2 includes: a first selector circuit configured to select n-th line in the parallel output data either from the first differential encoding circuit or from the second differential encoding circuit; and a second selector circuit configured to select either n-th line in the parallel output data from the first differential encoding circuit or delayed n-th line in the parallel output data from the second differential encoding circuit, wherein the first differential encoding circuit delays an output of the first selector circuit, and performs a differential encoding between the delayed output and an initial line of the parallel input data for the first differential encoding circuit, and wherein the second differential encoding circuit performs a differential encoding between an output of the second selector circuit and an initial line of the parallel input data for the second differential encoding circuit. Therefore, the parallel differential encoding circuit of Embodiment 2 can be applied to both an Apol-DPSK method that uses two-symbol-delay differential encoding and a general DPSK method that uses one-symbol-delay differential encoding. It allows sharing a common circuit with a LSI or a FPGA in order to achieve reduction in circuit size and suppression in power consumption.

(Embodiment 3.)

Figure 6:
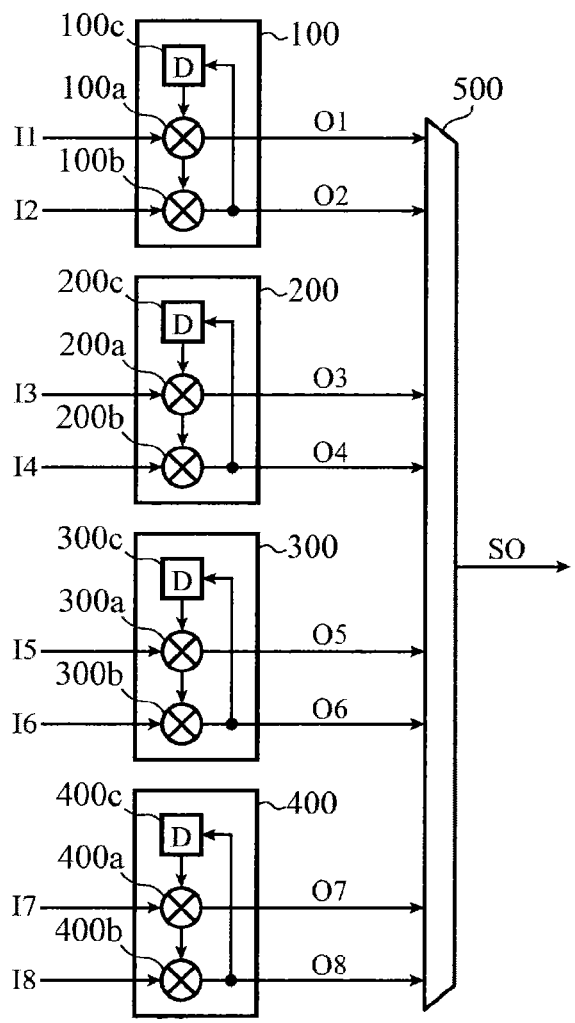
FIG. 6 is a configuration diagram showing a parallel differential encoding circuit of Embodiment 3 of the present invention.

FIG. 6 is a configuration diagram showing a parallel differential encoding circuit of Embodiment 3.

The parallel differential encoding circuit of Embodiment 3 includes a first differential encoding circuit 100, a second differential encoding circuit 200, a third differential encoding circuit 300 and a fourth differential encoding circuit 400. Similarly to the first differential encoding circuit 1 and the second differential encoding circuit 2 in Embodiment 1, each of the first differential encoding circuit 100 through the fourth differential encoding circuit 400 is a differential encoding circuit for DPSK, and performs calculations using two lines in parallel input data I1 to I8, (I1/I2, I3/I4, I5/I6 and I7/I8), and outputs two lines in parallel output data O1 to O8 (O1/O2, O3/O4, O5/O6 and O7/O8). That is, the first differential encoding circuit 100 is configured with exclusive OR logic circuits 100a-100b and a delay element 100c, the second differential encoding circuit 200 is configured with exclusive OR logic circuits 200a-200b and a delay element 200c, the third differential encoding circuit 300 is configured with exclusive OR logic circuits 300a-300b and a delay element 300c, and the fourth differential encoding circuit 400 is configured with exclusive OR logic circuits 400a-400b and a delay element 400c. A multiplexing circuit 500 is an 8:1 MUX which performs a time-multiplexing on eight lines parallel output signals. The multiplexing circuit 500 performs the time-multiplexing on the parallel output data O1 to O8 in an order of O1-O3-O5-O7-O2-O4-O6-O8, and outputs those data O1 to O8 as a serial output SO at a eight times rate.

Next, an operation of Embodiment 3 will be described. The first differential encoding circuit 100 through the fourth differential encoding circuit 400 perform calculations on the two-line parallel input data I1-I2, I3-I4, I5-I6 and I7-I8, and outputs the two lines parallel output data O1/O2, O3/O4, O5/O6 and O7/O8, respectively. The multiplexing circuit 500 outputs in the order of O1-O3-O5-O7-O2-O4-O6-O8 as a serial output SO. Accordingly, four-symbol-delay differential coded signals, which are to be decoded as transmission data by a four-symbol delay detector, are output as the serial output SO.

As described above, the parallel differential encoding circuit of Embodiment 3 as a parallel differential encoding circuit, that performs a differential encoding on parallel input data to generate parallel output data, which comprises: a first differential encoding circuit configured to perform a differential encoding on n-lines parallel input data ($2 \le n$; n denotes an integer) to generate n-lines parallel output data ($2 \le n$; n denotes an integer); a second differential encoding circuit configured to perform a differential encoding on n-lines parallel input data ($2 \le n$; n denotes an integer) to generate n-lines parallel output data ($2 \le n$; n denotes an integer); a third differential encoding circuit configured to perform a differential encoding on n-lines parallel input data ($2 \le n$; n denotes an integer) to generate n-lines parallel output data ($2 \le n$; n denotes an integer); a fourth differential encoding circuit configured to perform a differential encoding on n-lines parallel input data ($2 \le n$; n denotes an integer) to generate n-lines parallel output data ($2 \le n$; n denotes an integer); and a multiplexing circuit configured to multiplex the generated parallel output data from the first differential encoding circuits, the second differential encoding circuits, the third differential encoding circuits and the fourth differential encoding circuits in rotation, and configured to output the multiplexed data. According to this configuration, since the respective data of the four differential encoding circuits are multiplexed and output, it becomes possible to generate four-symbol differential coded signals. Therefore, it is capable of bringing such an effect that the parallel differential encoding circuit can use a transmission method which can reduce noises by way of delay detection between signals apart by four symbols at a receiver, and is capable of expanding a transmission distance.

(Embodiment 4.)

Figure 7:
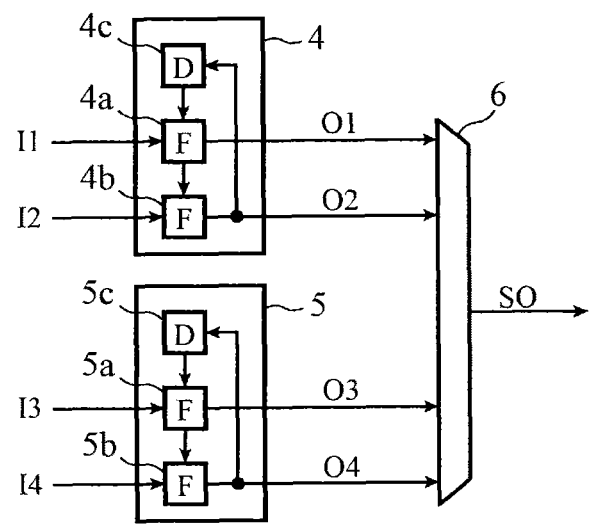
FIG. 7 is a configuration diagram showing a parallel differential encoding circuit of Embodiment 4 of the present invention.

FIG. 7 is a configuration diagram showing a parallel differential encoding circuit of Embodiment 4, which is applicable to a two-symbol delay.

The parallel differential encoding circuit of Embodiment 4 includes a first differential encoding circuit 4, a second differential encoding circuit 5 and a multiplexing circuit 6. The first differential encoding circuit 4 is a differential encoding circuit for DQPSK. The first differential encoding circuit 4 performs calculations on two lines of paired parallel input data I1 (I1I and I1Q) and I2 (I2I and I2Q) with respect to In-phase components (I) and Quadrature components (Q), and outputs two lines of paired parallel output data O1 (O1I and O1Q) and O2 (O2I and O2Q). The first differential encoding circuit 4 is configured with logic circuits 4a-4b and a delay element 4c. The first differential encoding circuit 4 includes a feedback path where the paired parallel output data O2 (O2I and O2Q) are delayed by the delay element 4c and are subjected to differential encoding operations with the paired parallel input data I1 (I1I and I1Q).

The second differential encoding circuit 5 is a differential encoding circuit for DQPSK. The second differential encoding circuit 5 performs calculations on two lines of paired parallel input data I3 (I3I and I3Q) and I4 (I4I and I4Q) with respect to In-phase components (I) and Quadrature components (Q), and outputs two lines of paired parallel output data O3 (O3I and O3Q) and O4 (O4I and O4Q). The second differential encoding circuit 5 is configured, similarly to the first differential encoding circuit 4, with logic circuits 5a-5b and a delay element 5c. The second differential encoding circuit 5 includes a feedback path where the paired parallel output data O4 (O4I and O4Q) are delayed by the delay element 5c and are subjected to differential encoding operations with the paired parallel input data I3 (I3I and I3Q). The multiplexing circuit 6 is a 4:1 MUX which performs a time-multiplexing on four lines parallel output signals. The multiplexing circuit 6 performs the time-multiplexing on the paired parallel output data O1 to O4 in an order of O1I-O1Q-O3I-O3Q-O2I-O2Q-Q4I-O4Q, and outputs those data O1 to O4 as paired serial outputs SO (SOI and SOQ) at four times the rate.

Figure 8:
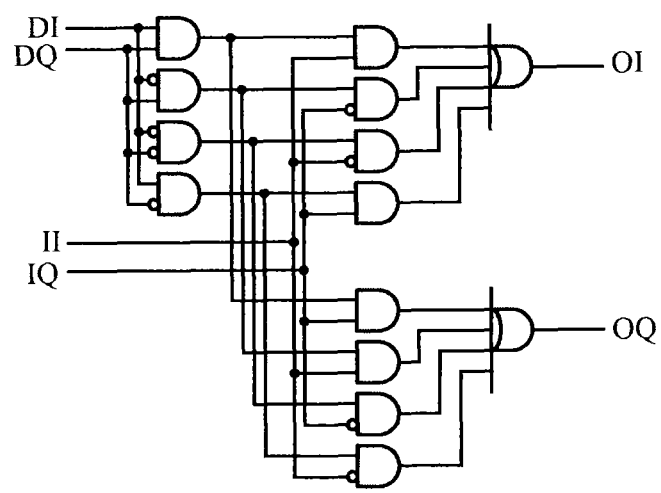
FIG. 8 is a circuit diagram showing a logic circuit in the parallel differential encoding circuit of Embodiment 4 of the present invention.

FIG. 8 depicts the details of each logic circuit 4a, 4b, 5a and 5b.

The logic circuit shown in the figure is configured with AND circuits and OR circuits. The logic circuit using a DQPSK method calculates output data OI and OQ to be output as an In-phase component and a Quadrature component for a phase modulator of DQPSK by using, as input signals, the paired input signals II/IQ and the feedback signals DI/DQ from the paired delay elements or adjacent output signals.

The serial outputs SOI and SOQ generated as illustrated in FIG. 7 becomes, similarly to Embodiment 1, two-symbol differential coded signals, which can be decoded as the original transmission data line through a two-symbol delay detector being used as a DQPSK decoder.

The differential encoding circuit applicable to the DQPSK method can be achieved in other way than the method of connecting the circuits in Embodiment 4, and thus, the effect according to this Embodiment 4 is not limited to that by the configuration shown in FIG. 7.

As described above, the parallel differential encoding circuit of Embodiment 4 as a parallel differential encoding circuit, that performs a differential encoding on parallel input data to generate parallel output data, which comprises: a first differential encoding circuit configured to perform a differential encoding on n-lines parallel input data (2≤n; n denotes an integer) to generate n-lines parallel output data (2≤n; n denotes an integer), each of the parallel input data and the parallel output data having a two bits combination; a second differential encoding circuit configured to perform a differential encoding on n-lines parallel input data (2≤n; n denotes an integer) to generate n-lines parallel output data (2≤n; n denotes an integer), each of the parallel input data and the parallel output data having a two bits combination; a multiplexing circuit configured to alternately multiplex the generated parallel output data from the first differential encoding circuit and the second differential encoding circuit, and configured to output the multiplexed data. Therefore, the parallel differential encoding circuit of this Embodiment 1 is capable of achieving a differential encoding applicable to a two-symbol delay detection, and enabling optical signals of the Apol-DQPSK method to expand transmission distance.

It should be noted that unlimited combination of the respective embodiments, modification of any configuration element in the embodiments and omission of any configuration element in the embodiments may be made in the present invention without departing from the scope of the invention.

INDUSTRIAL APPLICABILITY

As mentioned above, the parallel differential encoding circuit according to this invention is related to a configuration that can meet a long-distance transmission format which requires a two-bit delay detection, as that in an Apol-DPSK method or an Apol-DQPSK method, and therefore, it is suitable for use in a communication device, such as an optical fiber transmission device, a wireless transceiver and the like.

The invention claimed is:

1. A parallel differential encoding circuit that performs a differential encoding on parallel input data to generate parallel output data, comprising:
    a first differential encoding circuit configured to perform a differential encoding on n-lines parallel input data (2≤n; n denotes an integer) to generate n-lines parallel output data (2≤n; n denotes an integer);
    a second differential encoding circuit configured to perform a differential encoding on n-lines parallel input data (2≤n; n denotes an integer) to generate n-lines parallel output data (2≤n; n denotes an integer); and
    a multiplexing circuit configured to alternately multiplex the generated parallel output data from the first differential encoding circuit and the second differential encoding circuit, and configured to output the multiplexed data.

2. The parallel differential encoding circuit according to claim 1, further comprising:
    a first selector circuit configured to select n-th line in the parallel output data either from the first differential encoding circuit or from the second differential encoding circuit; and
    a second selector circuit configured to select either n-th line in the parallel output data from the first differential encoding circuit or delayed n-th line in the parallel output data from the second differential encoding circuit,
    wherein the first differential encoding circuit delays an output of the first selector circuit, and performs a differential encoding between the delayed output and an initial line of the parallel input data for the first differential encoding circuit, and
    wherein the second differential encoding circuit performs a differential encoding between an output of the second selector circuit and an initial line of the parallel input data for the second differential encoding circuit.

3. A parallel differential encoding circuit that performs a differential encoding on parallel input data to generate parallel output data, comprising:
    a first differential encoding circuit configured to perform a differential encoding on n-lines parallel input data (2≤n; n denotes an integer) to generate n-lines parallel output data (2≤n; n denotes an integer);
    a second differential encoding circuit configured to perform a differential encoding on n-lines parallel input data (2≤n; n denotes an integer) to generate n-lines parallel output data (2≤n; n denotes an integer);
    a third differential encoding circuit configured to perform a differential encoding on n-lines parallel input data (2≤n; n denotes an integer) to generate n-lines parallel output data (2≤n; n denotes an integer);
    a fourth differential encoding circuit configured to perform a differential encoding on n-lines parallel input data (2≤n; n denotes an integer) to generate n-lines parallel output data (2≤n; n denotes an integer); and a multiplexing circuit configured to multiplex the generated parallel output data from the first differential encoding circuit, the second differential encoding circuit, the third differential encoding circuit and the fourth differential encoding circuit in rotation, and configured to output the multiplexed data.

4. A parallel differential encoding circuit that performs a differential encoding on parallel input data to generate parallel output data, comprising:

a first differential encoding circuit configured to perform a differential encoding on n-lines parallel input data (2≤n; n denotes an integer) to generate n-lines parallel output data (2≤n; n denotes an integer), each of the parallel input data and the parallel output data having a two bits combination;

a second differential encoding circuit configured to perform a differential encoding on n-lines parallel input data (2≤n; n denotes an integer) to generate n-lines parallel output data (2≤n; n denotes an integer), each of the parallel input data and the parallel output data having a two bits combination;

a multiplexing circuit configured to alternately multiplex the generated parallel output data from the first differential encoding circuit and the second differential encoding circuit, and configured to output the multiplexed data.

\* \* \* \* \*